(12) United States Patent
Xie et al.

(10) Patent No.: US 11,876,114 B2
(45) Date of Patent: Jan. 16, 2024

(54) AIRGAP GATE SPACER

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 17/467,524

(22) Filed: Sep. 7, 2021

(65) Prior Publication Data

US 2023/0077243 A1 Mar. 9, 2023

(51) Int. Cl.
*H01L 29/06* (2006.01)
*H01L 29/08* (2006.01)
(Continued)

(52) U.S. Cl.
CPC ...... *H01L 29/0653* (2013.01); *H01L 29/0847* (2013.01); *H01L 29/6656* (2013.01); *H01L 29/7851* (2013.01)

(58) Field of Classification Search
CPC ............. H01L 29/6656; H01L 29/0653; H01L 29/0653; H01L 29/4991; H01L 21/76802; H01L 21/764; H01L 21/7682; H01L 29/515; H01L 21/823468; H01L 21/823864; H01L 29/41791; H01L 29/66795; H01L 29/785; H01L 29/41775; H01L 29/66636; H01L 29/7848; H01L 29/165; H01L 21/762;
(Continued)

(56) References Cited

U.S. PATENT DOCUMENTS 7,741,663 B2 6/2010 Hause
9,305,835 B2 4/2016 Alptekin
(Continued)

OTHER PUBLICATIONS

H. Niebojewski-etal, "Self-aligned contacts for 10nm FDSOI Node: From device to circuit evaluation," 2013 IEEE SOI-3D-Subthreshold Microelectronics Technology Unified Conference (S3S), 2013, pp. 1-2, doi: 10.1109/S3S.2013.6716549.
(Continued)

*Primary Examiner* — Sonya McCall-Shepard
(74) *Attorney, Agent, or Firm* — Matthew Zehrer

(57) ABSTRACT

A semiconductor device includes a gate structure that is formed upon and around a channel fin. The device further includes a source or drain (S/D) region connected to the fin. A spacer liner is located upon a sidewall of the S/D region facing the gate structure. An air-gap spacer is located between the gate structure and the spacer liner. A spacer ear is located above the air-gap spacer between the gate structure and the spacer liner. The spacer ear may be formed by initially forming an inner spacer upon a sidewall of the gate structure and forming an outer spacer upon the inner spacer. The outer spacer may be recessed below the inner spacer and the spacer ear may be formed upon the recessed outer spacer. Subsequently, the inner spacer and outer spacer may be removed to form the air-gap spacer while retaining the spacer ear.

17 Claims, 17 Drawing Sheets

(51) Int. Cl.
  *H01L 29/66* (2006.01)
  *H01L 29/78* (2006.01)
  *H01L 29/49* (2006.01)
  *H01L 29/165* (2006.01)

(58) Field of Classification Search
  CPC ..... H01L 21/76224–76237; H01L 21/823481; H01L 21/823878; H01L 29/0649–0653; H01L 29/41725; H01L 29/41766; H01L 21/823828; H01L 29/41783; H01L 21/823814
  See application file for complete search history.

(56) References Cited

U.S. PATENT DOCUMENTS

| | | | |
|---|---|---|---|
| 9,368,572 B1 | 6/2016 | Cheng | |
| 10,008,577 B2 | 6/2018 | Xie | |
| 10,204,999 B2 | 2/2019 | Lee | |
| 10,388,747 B1* | 8/2019 | Xie | H01L 21/7682 |
| 10,446,653 B2 | 10/2019 | Xie | |
| 10,679,906 B2 | 6/2020 | Cheng | |
| 10,840,351 B2 | 11/2020 | Cheng | |
| 10,886,378 B2 | 1/2021 | Xie | |
| 11,011,638 B2 | 5/2021 | Xie | |
| 11,031,485 B2 | 6/2021 | Cheng | |
| 2015/0091089 A1* | 4/2015 | Niebojewski | H01L 29/6656 438/151 |
| 2017/0352657 A1* | 12/2017 | Bergendahl | H01L 21/823468 |
| 2018/0138280 A1* | 5/2018 | Li | H01L 29/4991 |
| 2019/0296123 A1* | 9/2019 | Lee | H01L 29/512 |
| 2019/0333812 A1* | 10/2019 | Seong | H01L 29/6656 |
| 2019/0334008 A1* | 10/2019 | Chen | H01L 29/6653 |
| 2020/0075417 A1* | 3/2020 | Lee | H01L 29/665 |
| 2020/0212192 A1 | 7/2020 | Xie | |

OTHER PUBLICATIONS

IPCOM000255777D, "Process for Forming CMOS Airgap Spacer Via Contact Liner Etch" Disclosed Anonymously, Oct. 12, 2018.

\* cited by examiner

AIRGAP GATE SPACER

BACKGROUND

Various embodiments of the present application generally relate semiconductor device fabrication methods and resulting structures. More specifically the various embodiments relate to air-gap spacer(s) that are formed upon respective sidewall(s) of a FET gate.

SUMMARY

In an embodiment of the present invention, a semiconductor device is presented. The semiconductor device includes a gate structure upon and around a fin. The semiconductor device further includes a source or drain (S/D) region connected to the fin. The semiconductor device further includes a spacer liner upon a sidewall of the S/D region facing the gate structure. The semiconductor device further includes an air-gap spacer between the gate structure and the spacer liner and a spacer ear above the air-gap spacer between the gate structure and the spacer liner.

In an embodiment of the present invention, another semiconductor device is presented. The semiconductor device includes a gate structure upon and around a fin pair that includes a first fin and a second fin. The semiconductor device further includes a source or drain (S/D) region connected to the first fin and to the second fin. The semiconductor device further includes a spacer liner upon a sidewall of the S/D region facing the gate structure. The semiconductor device further includes an air-gap spacer between the gate structure and the spacer liner and a spacer ear above the air-gap spacer between the gate structure and the spacer liner.

In another embodiment of the present invention, a semiconductor device fabrication method is presented. The method includes forming a multilayer spacer upon a sidewall of a sacrificial gate structure. The multilayer spacer includes an inner spacer upon the sidewall of the sacrificial gate structure and an outer spacer upon the inner spacer. The method further includes recessing a top surface of the outer spacer below a top surface of the inner spacer. The method further includes forming a spacer ear upon the recessed outer spacer. The method further includes removing the sacrificial gate structure and forming a replacement gate structure in place thereof. The method further includes removing the multilayer spacer to form an air-gap spacer upon a sidewall of the replacement gate structure.

These and other embodiments, features, aspects, and advantages will become better understood with reference to the following description, appended claims, and accompanying drawings.

DETAILED DESCRIPTION

Figure 1:
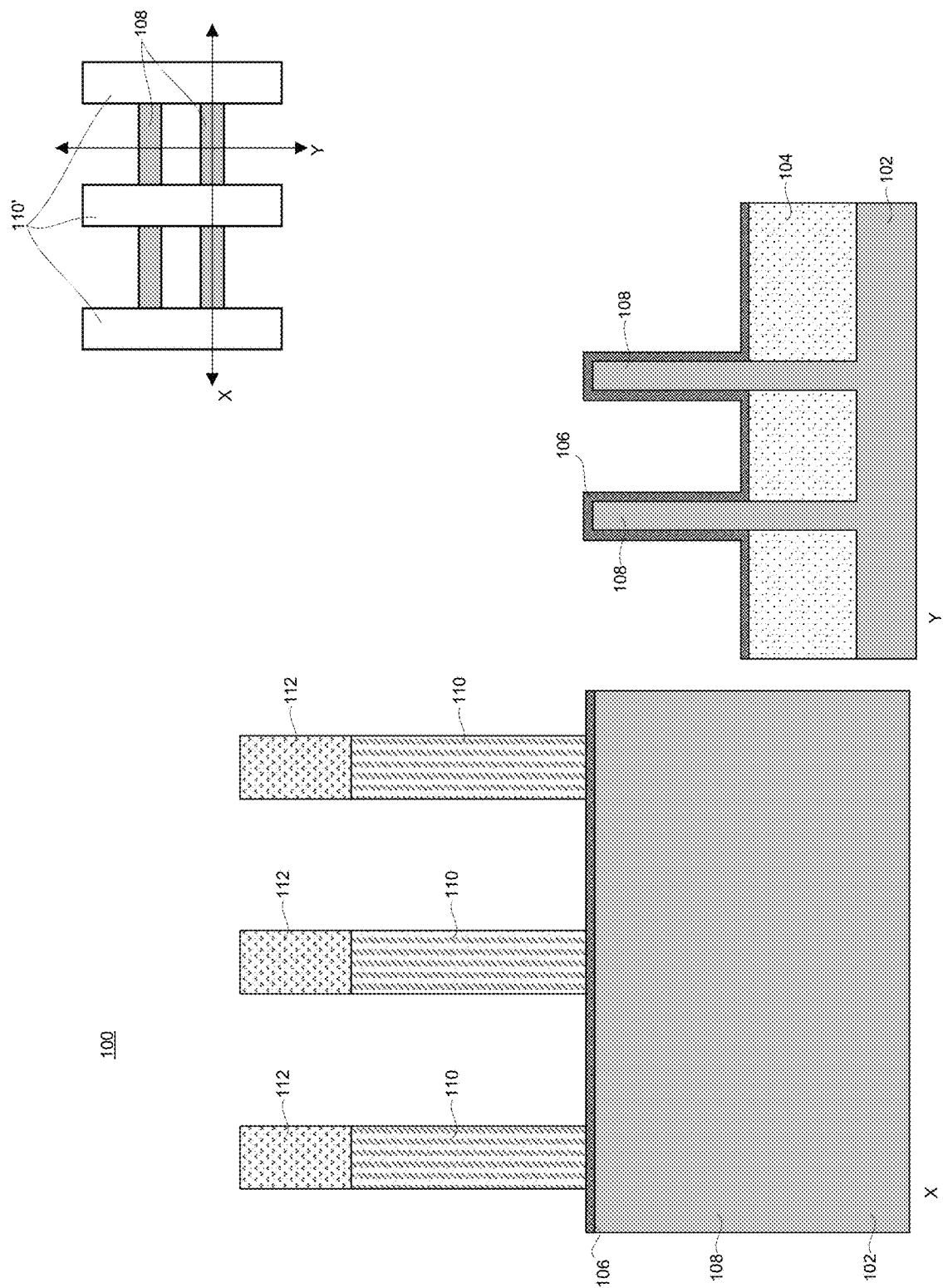
FIG. 1 through FIG. 16 depict cross-sectional views of a semiconductor device shown after respective fabrication operations, in accordance with one or more embodiments.

It is understood in advance that although a detailed description is provided herein of an exemplary FET architecture that includes an air-gap spacer(s) around the FET gate, which may be referred herein as the gate, implementation of the teachings recited herein are not limited to the particular FET architecture described herein. Rather, embodiments of the present invention are capable of being implemented in conjunction with any other appropriate type of FET device now known or later developed.

The formation of the air-gap spacer around the gate has proven challenging, especially in those FETs that utilize a subsequent self-aligned contact fabrication stage. In these particular FETs, the contact etch may open the air-gap which may ultimately result in a subway defect (i.e., when a void in the semiconductor device is undesirably filled with a conductive material which may cause electrical shorts, yield degradation, or the like). Designing such contacts far-away from the airgap spacer has proven to be an known effective way to suppress subway defects, however, such distance reduces the semiconductor device scaling factor.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel region. Disposed above the channel region is a gate. The gate and the channel are spaced apart by a gate dielectric layer. The channel connects the source and the drain, and electrical current flows through the channel from the source to the drain. The electrical current flow is induced in the channel region by a voltage applied at the gate.

One or more embodiments of the invention also provide fabrication methods and resulting FET structures that include an air-gap spacer upon sidewall(s) of the gate. The air-gap spacer may reduce gate to drain capacitance and may increase the semiconductor device scaling factor.

FIG. 1 depicts cross-sectional views of a semiconductor device 100 shown after fabrication operations, in accordance with one or more embodiments. Semiconductor device 100 is depicted in FIG. 1 though FIG. 16 at various fabrication stages. The cross-section views of the depicted semiconductor device 100 structures depicted in FIG. 1 through FIG. 16 are defined by the cross-sectional planes depicted in FIG. 1 and are used throughout the remaining structural drawings. As depicted, the X cross-sectional plane dissects a fin 108 along its length and across gates 110', and the Y cross-sectional plan dissects a fin 108 along its width, generally in the FET source/drain region(s). The depicted gates 110' may be sacrificial gate structures or replacement gate structures, as appropriate.

After associated fabrication operations, semiconductor device 100 may include a substrate 102, one or more channel fins 108, hereinafter referred to as fins 108, one or more shallow trench isolation (STI) regions 104, gate dielectric layer 106, and one or more sacrificial gates 110 with a gate mask 112 thereupon.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material. Alternatively, as depicted, the substrate 102 may be substrate on insulator (e.g., silicon on insulator (SOI), or the like) that may include a substrate 104, such as a Si substrate 104, an insulator 106, such as a SiO insulator, upon the substrate 104, and a semiconductor layer 108, such as a Si semiconductor layer 108, upon the insulator 106.

Utilizing known patterning, lithography, etching, etc. techniques, undesired portions of the substrate 102 may be removed while desired portions thereof may be retained and may form fins 108. Fins 108 can be patterned by conventional patterning techniques, such as Self-Aligned Double Patterning (SADP), Self-Aligned Quadruple Patterning (SAQP), etc.

STI regions 104, or portion(s) thereof, may be formed by depositing STI material(s), such as a dielectric known in the art, upon the substrate 102 and upon and between fins 108. The STI regions 104 may be formed by depositing the STI material by for example, PVD, CVD, ALD, or the like, followed by chemical mechanical polish (CMP) and STI regions 104 recess to reveal the desired portion(s) of fins 108. As is known in the art, STI regions 104 may, at least partially, electrically isolate neighboring FET components or features. Exemplary STI region 104 material(s) may be $SiO_2$, a thin layer of conformal silicon nitride (SiN) and Silicon Dioxide ($SiO_2$), or the like.

Gate dielectric layer 106, may be formed by depositing gate dielectric material(s), such as Silicon Oxide, upon STI regions 104 and upon and between fins 108. Gate dielectric layer 106 may be formed by depositing the gate dielectric material(s), by for example, PVD, CVD, ALD, or the like.

Sacrificial gates 110 may be formed upon STI region(s) 104 and upon and between fins 108. Sacrificial gates 110 may be formed by depositing sacrificial gate material, materials, or layers of material(s), by PVD, CVD, ALD, or the like. Exemplary sacrificial gate 110 materials may be SiGe, or the like.

In some embodiments, a sacrificial gate 110 material layer may be formed upon the gate dielectric layer 106 above STI region(s) 104 and above and around fin(s) 108. Subsequently a gate mask 112 layer may be formed upon the sacrificial gate 110 material layer. The gate mask 112 layer may be a hard mask layer. Exemplary mask 112 layer materials may be SiN, a combination of SiN and $SiO_2$, or the like.

Utilizing known patterning, lithography, etching, etc. techniques, undesired portions of the gate mask 112 may be removed, followed by further removal of the sacrificial gate 110 material layer that is not covered by the gate hard mask, while desired portions of sacrificial gate 110 material layer and associated desired portions of the gate mask 112 layer may be retained. These retained features may respectively form sacrificial gates 110 with a gate mask 112 thereupon. The combined structure of the sacrificial gate 110 and the associated gate mask 112 may be referred herein as a sacrificial gate structure.

Figure 2:
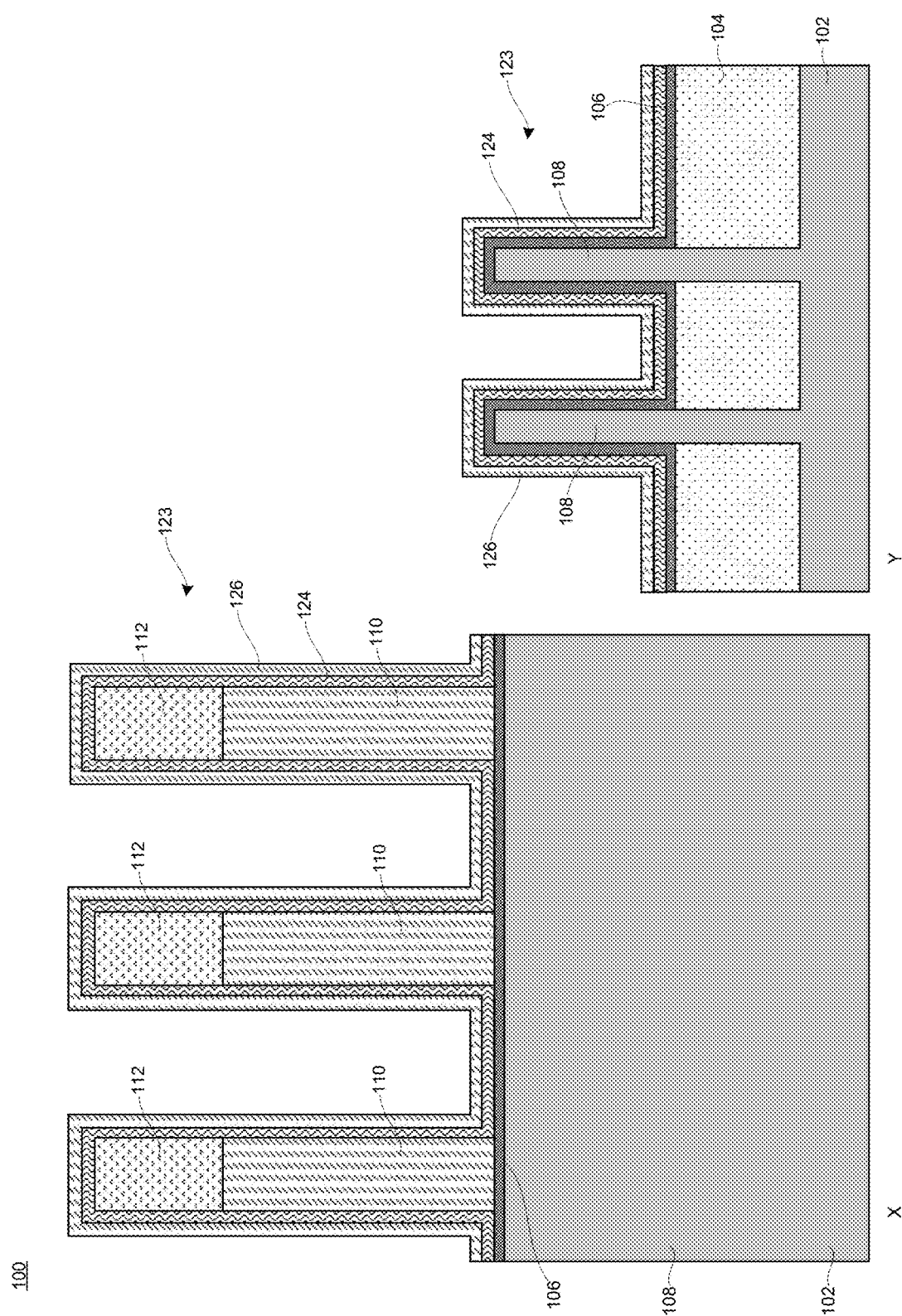

FIG. 2 depicts cross-sectional views of semiconductor structure 100 shown after a fabrication operation, in accordance with one or more embodiments. At the present fabrication operation, multilayer spacer 123 may be formed upon and around sacrificial gate structure(s) and upon and around fin(s) 108.

Multilayer spacer 123 may include at least an inner spacer 124 and an outer spacer 126. Multilayer spacer 123 may be formed by forming a blanket inner spacer 124 layer upon gate dielectric layer 106 above STI region(s) 104 and around fin(s) 108 and further forming the blanket inner spacer 124 upon and around sacrificial gate(s). The inner spacer 124 layer can have a thickness of from about 1 nm to about 6 nm, although other thicknesses are within the contemplated scope. The inner spacer 124 layer can be a sacrificial material different than sacrificial gate 110, such as amorphous Si, or the like. Multilayer spacer 123 may be further formed by subsequently forming a blanket outer spacer 126 layer upon inner spacer 124 layer above STI region(s) 104 and around fin(s) 108 and further forming the blanket outer spacer 126 upon inner spacer 124 layer upon and around sacrificial gate(s). The outer spacer 126 layer can have a thickness of from about 1 nm to about 6 nm, although other thicknesses are within the contemplated scope. The outer spacer 126 layer can be a sacrificial material different than sacrificial spacer 124, such as amorphous SiGe, or the like. In particular embodiments, the outer spacer 126 may be formed of the same material as the sacrificial gate 110 material.

Multilayer spacer 123 may be formed by depositing inner spacer 124 material by CVD, ALD, or the like, and subsequently depositing outer spacer 126 material by CVD, ALD, or the like.

Figure 3:
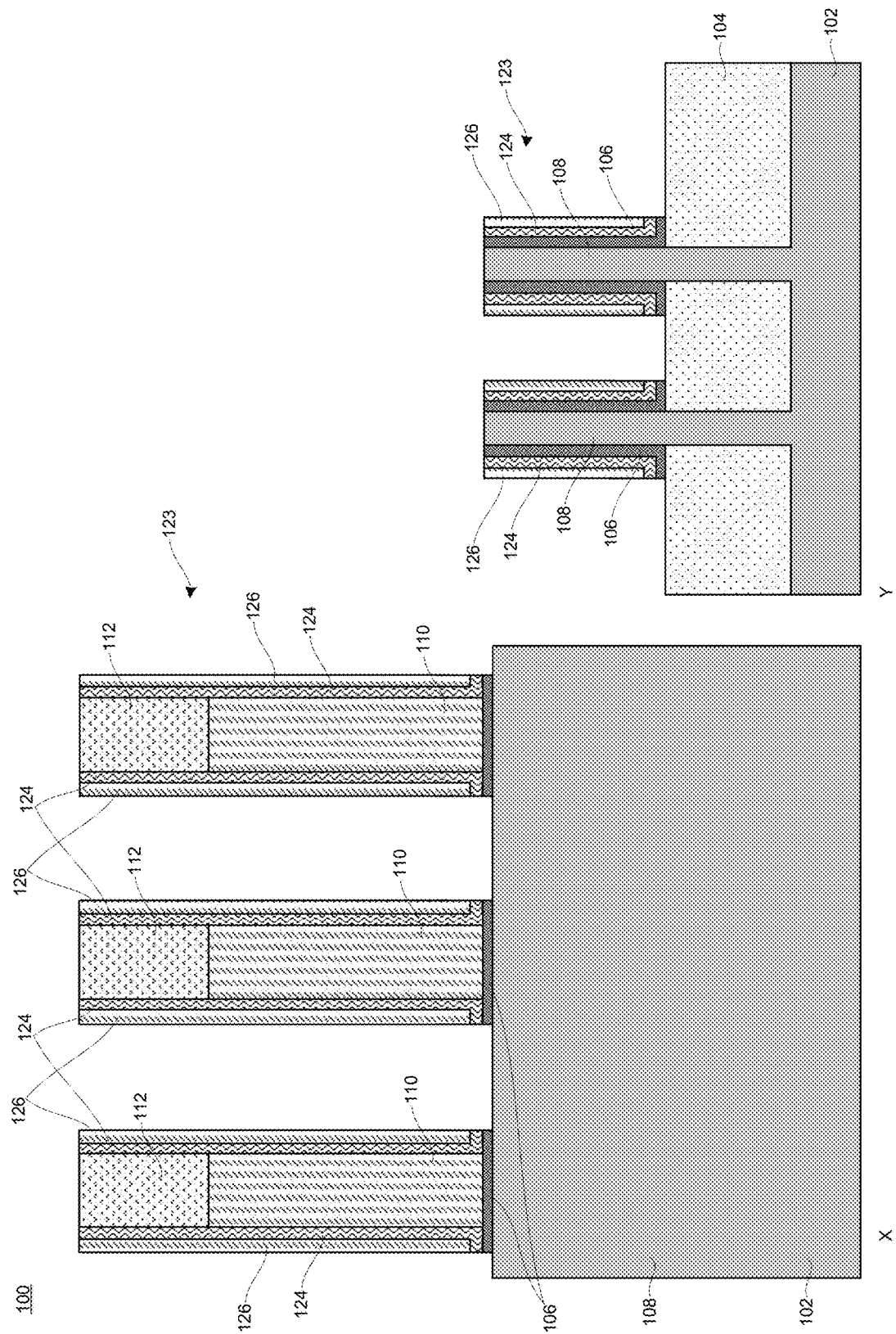

FIG. 3 depicts cross-sectional views of semiconductor structure 100 shown after a fabrication operation, in accordance with one or more embodiments. At the present fabrication operation, multilayer spacer 123 may be shaped and gate dielectric layer 106 may be partially removed.

The multilayer spacer 123 may be shaped by removing horizontal portions of multilayer spacer 123 at horizontal surfaces. The horizontal portions of multilayer spacer 123 may be removed by known etching techniques, such as an anisotropic reactive ion etch (ME). The undesired horizontal portions of multilayer spacer 123 may be associated with or juxtaposed against respective upper surfaces of sacrificial gate(s) and fin(s) 108. Further undesired horizontal portions of multilayer spacer 123 may be associated with or above respective STI region 104 and/or fin 108 upper surface(s) and outside the footprint of substantially vertical sidewalls of outer spacer 126. The shaped multilayer spacer 123 may therefore be effectively formed upon the vertical sidewalls of the sacrificial gate structure(s) and upon the vertical sidewalls of fin(s) 108. In some embodiments, the inner spacer 124 may be formed in a "L" shape or backward "L" shape that has a vertical portion associated with the sacrificial gate structure(s) and the fin(s) 108 and a horizontal portion generally under the outer spacer 126.

Gate dielectric layer 106 may be partially removed by a post etch cleaning process that removes undesired horizontal portions of gate dielectric layer 106 material associated with or above respective STI region 104 and/or fin 108 upper surface(s) and outside the footprint of substantially vertical sidewalls of outer spacer 126. In some embodiments, as depicted in the X-cross section, the retained gate dielectric layer 106 material may be generally located below the sacrificial gate structure. Similarly in some embodiments, as depicted in the Y-cross section, the retained gate dielectric layer 106 associated with the sidewall of fin(s) 108 may be formed in a "L" shape or backward "L" shape that has a vertical portion associated with the fin(s) 108 and a horizontal portion generally between the multilayer spacer 123 and STI region 104.

Figure 4:
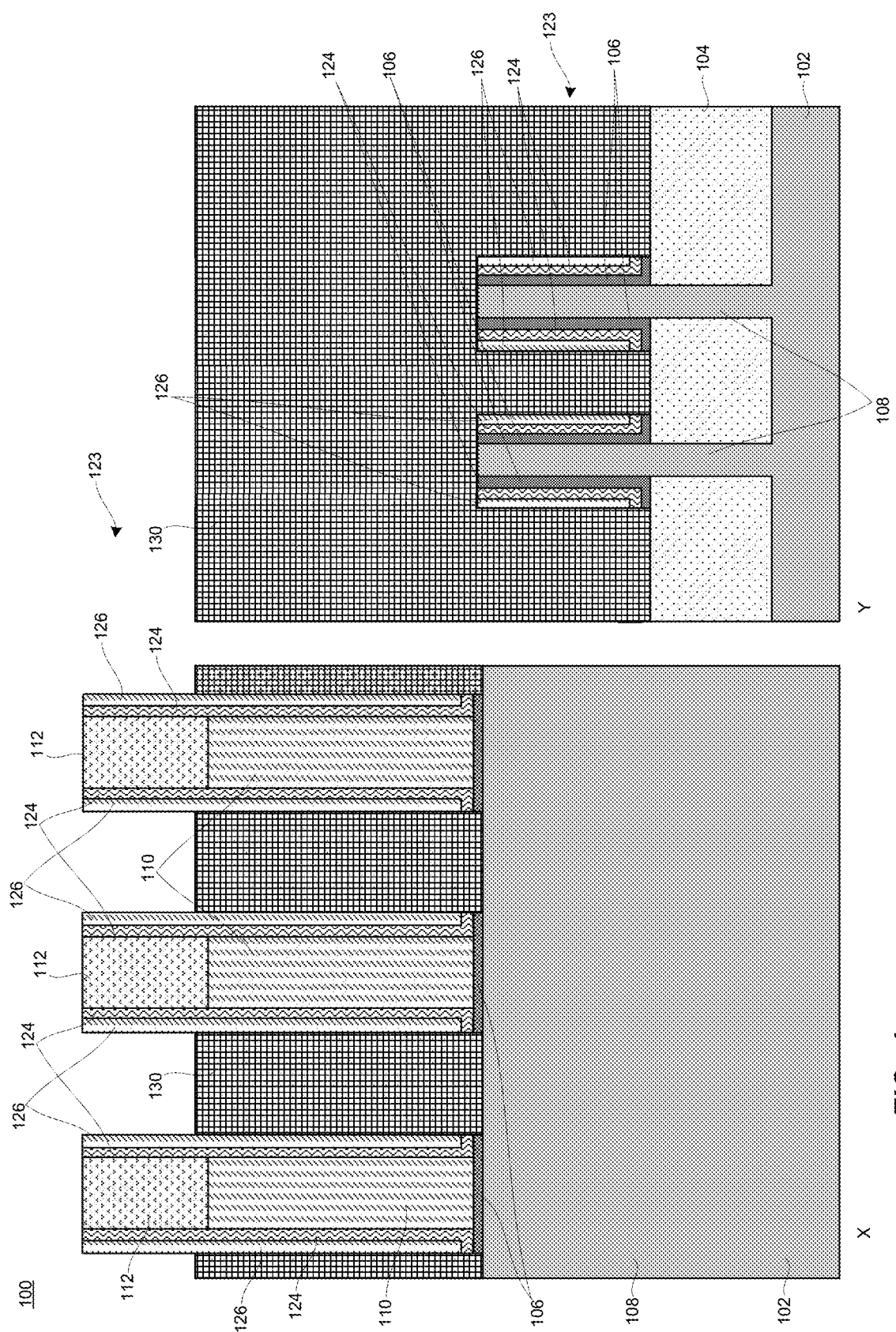

FIG. 4 depicts cross-sectional views of semiconductor structure 100 shown after a fabrication operation, in accordance with one or more embodiments. At the present fabrication operation, a soft mask 130 may be formed.

Soft mask 130 may be formed by depositing a soft mask material, such as an organic planarization layer (OPL). Subsequently, the soft mask 130 may be recessed to an appropriate or desired thickness. In some embodiments, as depicted, soft mask 130 may be formed to a thickness so the top surface of soft mask 130 is above the top surface of sacrificial gate material 110 and/or below the top surface of the gate mask 112. As depicted in the X cross-section, soft mask 130 may be formed upon at least respective top surface portion(s) of fin 108 and upon respective sidewall portions of outer spacer 126, inner spacer 124, and gate dielectric layer 106. As depicted in the Y cross-section, soft mask 130 may be formed upon portion(s) of fin 108, upon and around multilayer spacer 123, upon and around gate dielectric layer 106, and upon STI region(s) 104.

Figure 5:
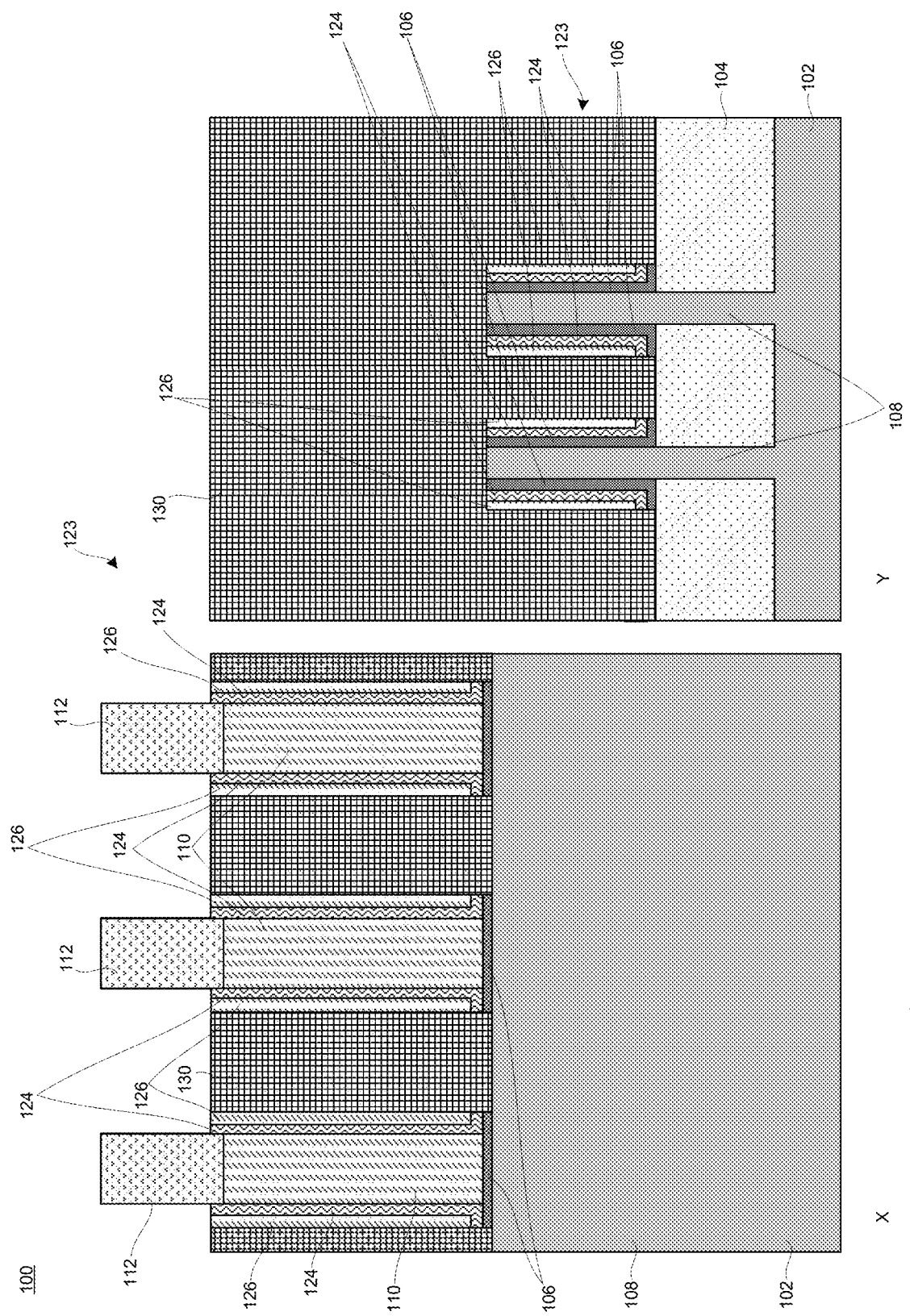

FIG. 5 depicts cross-sectional views of semiconductor structure 100 shown after a fabrication operation, in accordance with one or more embodiments. At the present fabrication operation, multi spacer 124 may be recessed.

The multi spacer 124 may be recessed by pulling down, removing, etching, or otherwise removing the exposed multi spacer 124 material above the recessed soft mask 130. In such process(es), soft mask 130 may be formed and recessed so portion(s) of multi spacer 124 that are upon respective sidewall(s) of the sacrificial gate structures are protected by soft mask 130, while top portions of multi spacer 124 that are upon sidewall(s) of sacrificial gate structure(s) may be exposed and removed. In some embodiments, the multilayer spacer 123 is recessed so the top surface of the multilayer spacer 123 is substantially coplanar with the top surface of soft mask 130.

Figure 6:
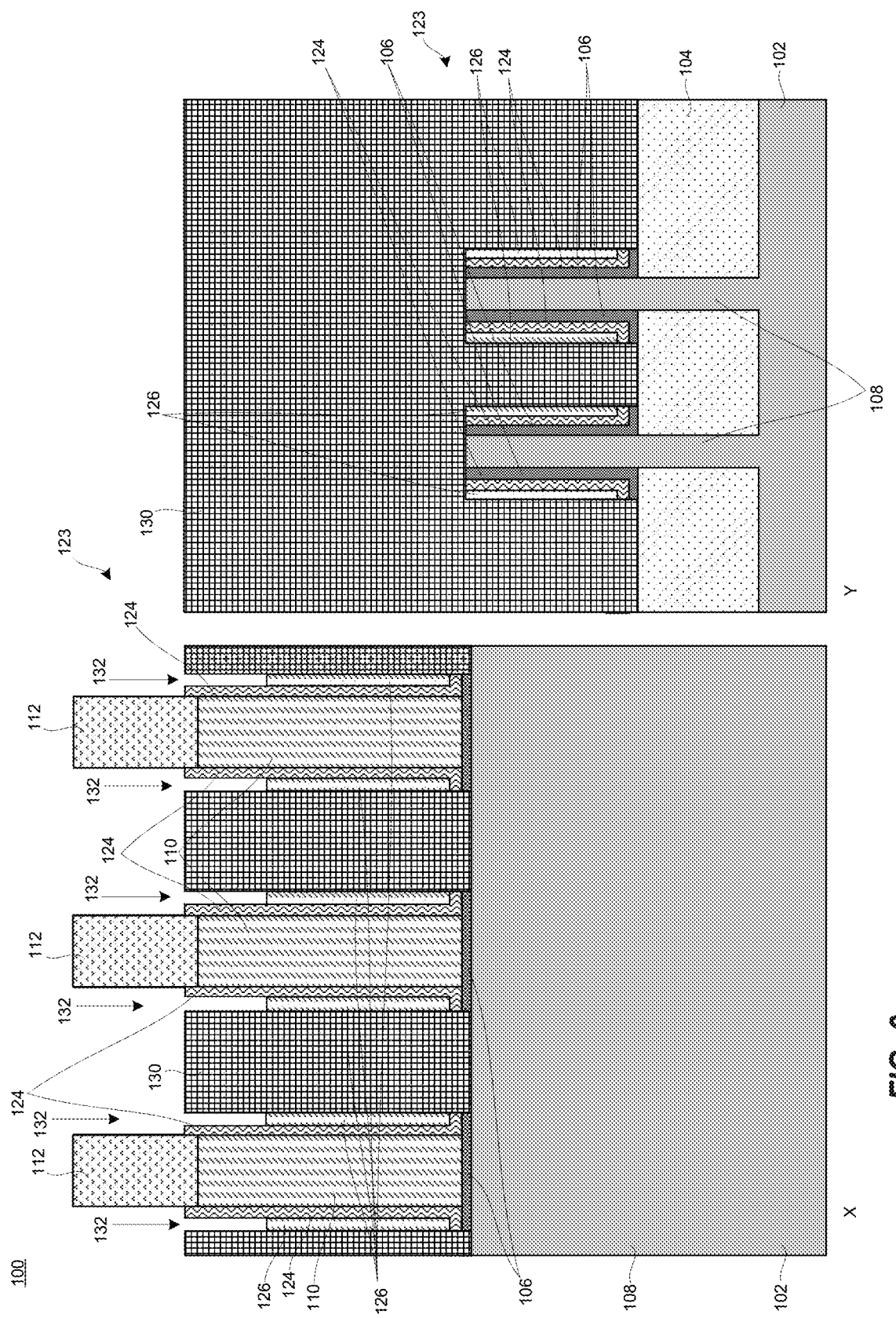

FIG. 6 depicts cross-sectional views of semiconductor structure 100 shown after a fabrication operation, in accordance with one or more embodiments. At the present fabrication operation, outer spacer 126 may be recessed below the top surface of inner spacer 124.

Utilizing known etching techniques, top portions of outer spacer 126 may be removed, while bottom portions of outer spacer 126 may be retained. For example, outer spacer 126 may be recessed by a etch selective to materials of the exposed surfaces of structure 100 (e.g., gate mask 112, inner spacer 124, soft mask 130, etc.). The removed outer spacer 126 material may respectively form spacer trench 132 located between inner spacer 124 and soft mask 130 and further located above the retained outer spacer 126.

Figure 7:
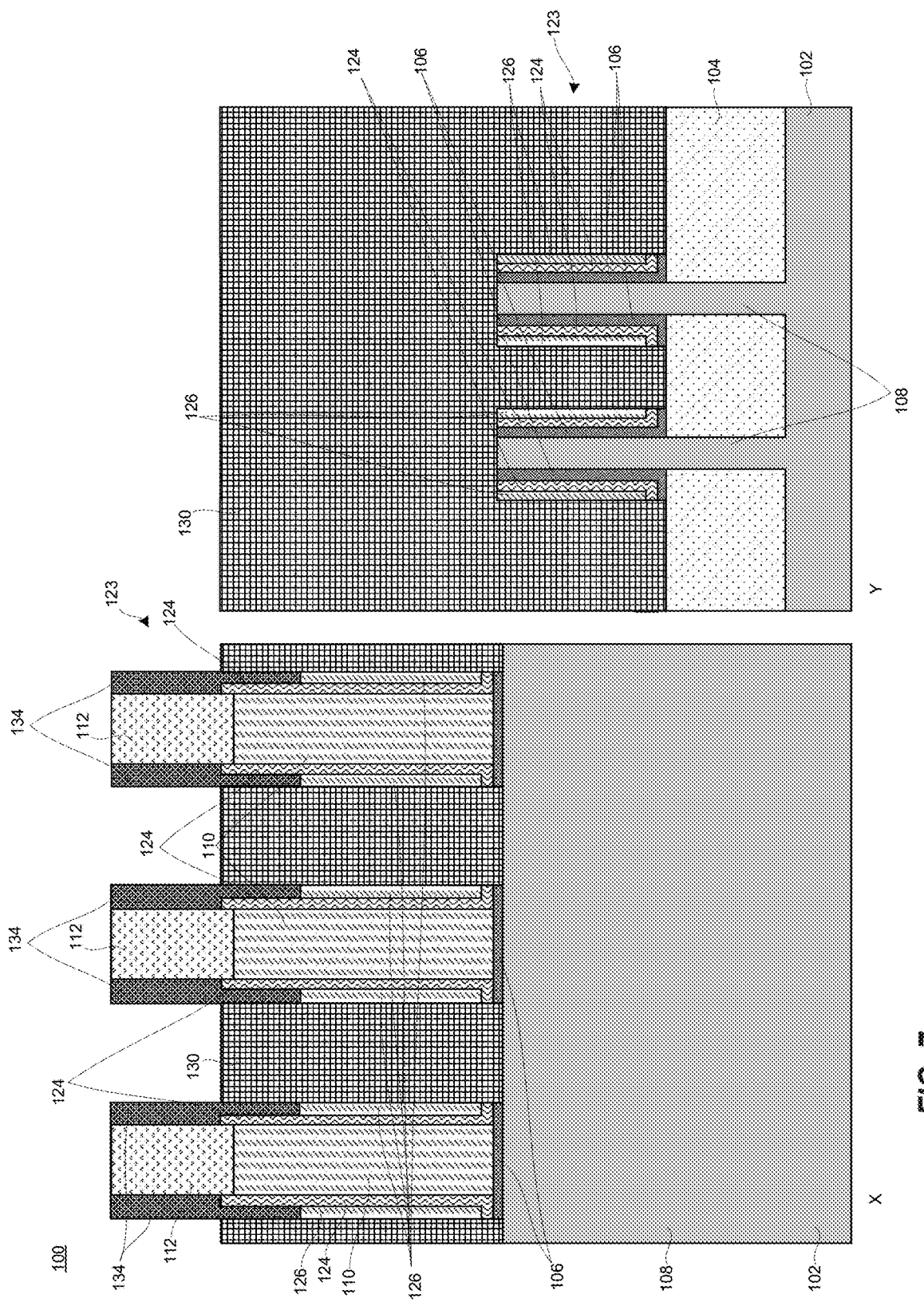

FIG. 7 depicts cross-sectional views of semiconductor structure 100 shown after a fabrication operation, in accordance with one or more embodiments. At the present fabrication operation, spacer ear 134 may be formed upon the recessed outer spacer 126 within spacer trench 132.

In some embodiments, spacer ear 134 material layer may be formed upon outer spacer 126 within spacer trench 132, upon inner spacer 124, upon soft mask 130, and upon gate mask 112. Exemplary spacer ear 134 materials may be SiN, SiBCN, SiOCN, SiOC, or the like.

In some embodiments, respective outer sidewalls of spacer ear 134 may be substantially coplanar with respective outer sidewalls of outer spacer 126, respective inner sidewalls of spacer ear 134 may be substantially coplanar with respective inner sidewalls of inner spacer 124, respective top surfaces of spacer ear 134 may be substantially coplanar with respective top surfaces of gate mask 112, etc.

Figure 8:
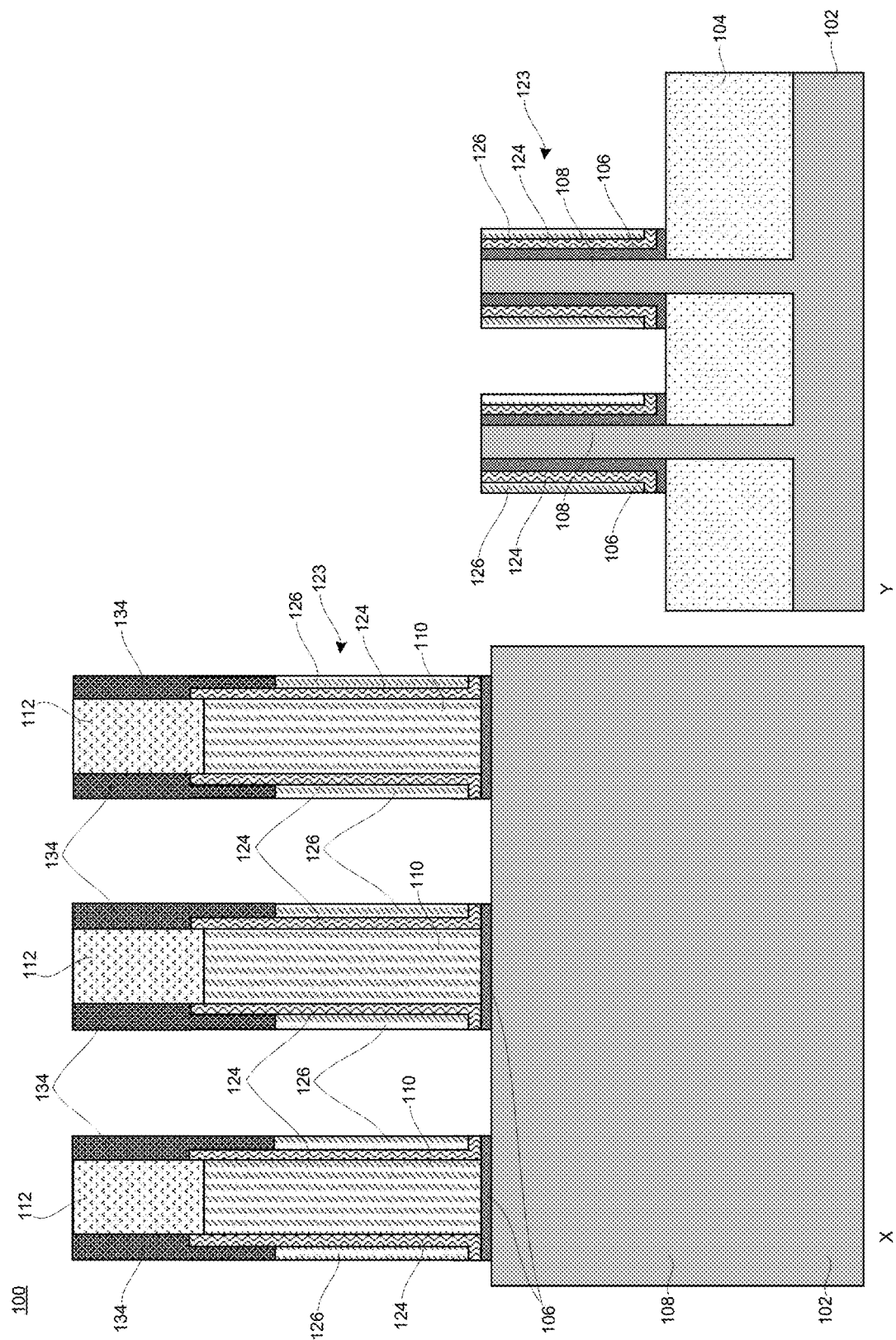

FIG. 8 depicts cross-sectional views of semiconductor structure 100 shown after a fabrication operation, in accordance with one or more embodiments. At the present fabrication operation, soft mask 130 may be removed.

Utilizing known patterning, lithography, etching, etc. techniques, soft mask 130 may be removed. For example, soft mask 130 may be removed by a N2/H2 ash, or the like. As depicted in the X cross-section, removal of soft mask 130 may expose fin 108 and may expose respective sidewall portions of gate dielectric 106, inner spacer 124, outer spacer 126, and spacer ear 134. As depicted in the Y cross-section, removal of soft mask 130 may expose fin 108, may portions of gate dielectric 106, may expose portions of inner spacer 124, and may expose the outer spacer 126.

Figure 9:
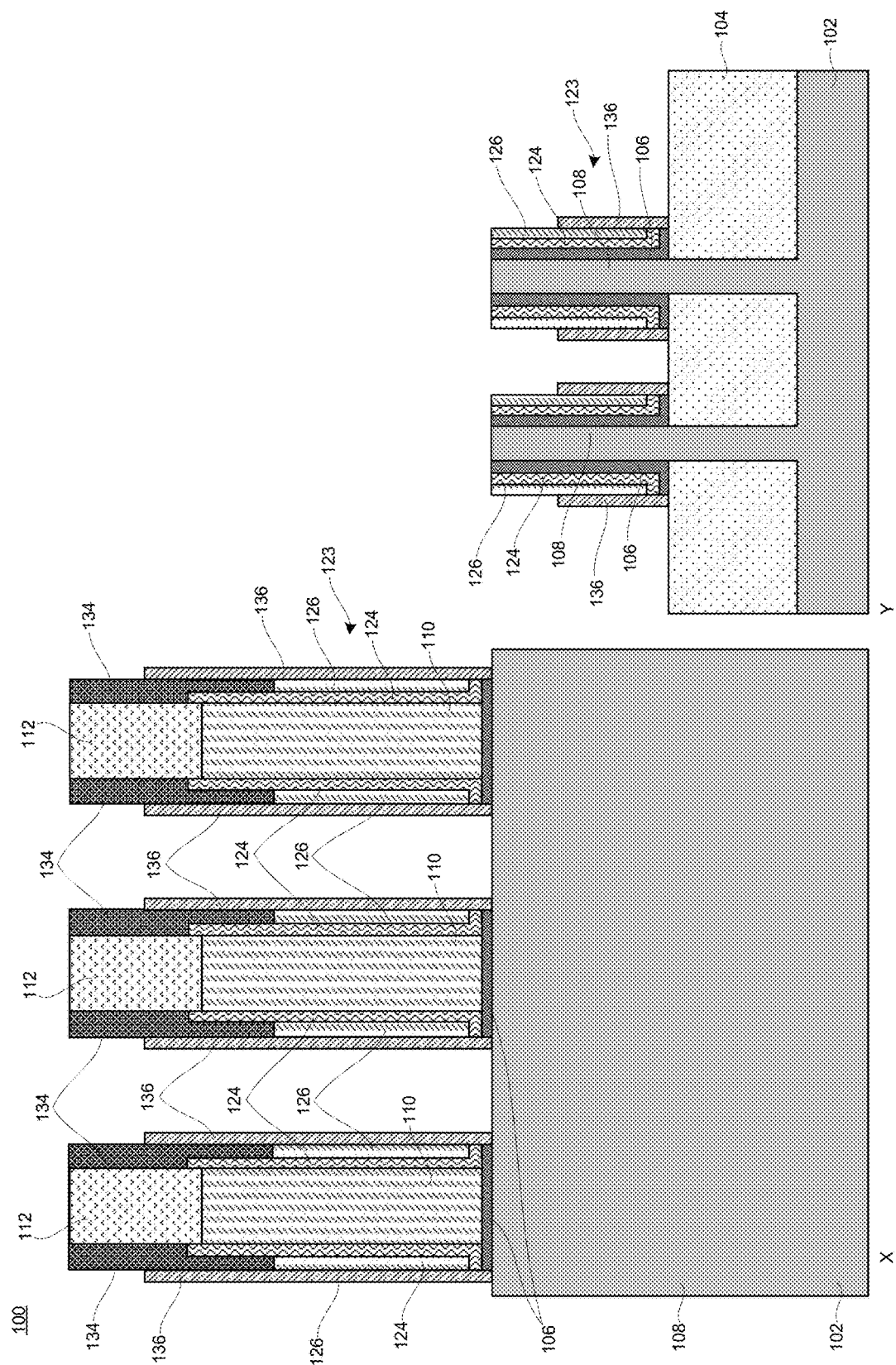

FIG. 9 depicts cross-sectional views of semiconductor structure 100 shown after a fabrication operation, in accordance with one or more embodiments. At the present fabrication operation, spacer liner 136 may be formed.

In some embodiments, as depicted in the X cross-section, a spacer liner 136 material layer may be formed upon the exposed fin 108 and upon respective exposed sidewall portions of gate dielectric 106, inner spacer 124, outer spacer 126, and spacer ear 134. In these embodiments, as depicted in the Y cross-section, the spacer liner 136 material layer may be further formed upon STI region(s) 104 and upon respective exposed sidewall portions of gate dielectric 106, exposed sidewall portions of inner spacer 124, and exposed sidewall portions of outer spacer 126. Exemplary spacer liner 136 materials may be $SiN_x$, $SiBCN_x$, SiOCN, SiCO, or SiC, or the like.

Utilizing known patterning, lithography, etching, etc. techniques, horizontal portions and top portions of spacer liner 136 material layer may be removed by an anisotropic etch, while bottom portions of the spacer liner 136 material layer may be retained. These retained substantially vertical spacer liner material may respectively form substantially vertical spacer liner(s) 136 upon respective vertical sidewalls surfaces of gate dielectric 106, inner spacer 124, outer spacer 126, and spacer ear 134. In some embodiments, as depicted in the X cross-section, the top surface of spacer liner 136 may be above the top surface of sacrificial gate 110. In some embodiments, as depicted in the Y cross-section, the top surface of spacer liner 136 may be 3 to 30 nm lower than the top surface of the fin 108.

Figure 10:
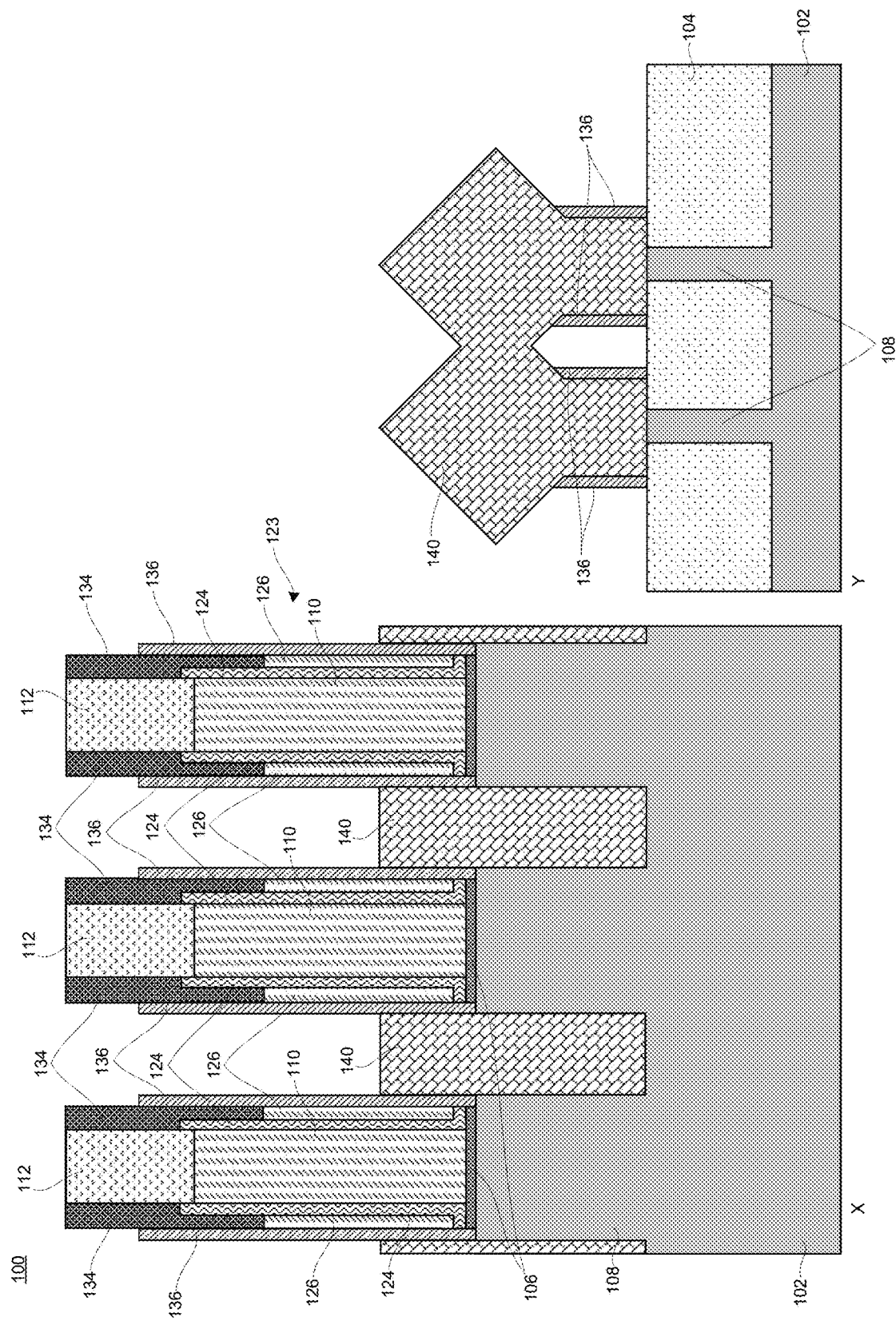

FIG. 10 depicts cross-sectional views of semiconductor structure 100 shown after a fabrication operation, in accordance with one or more embodiments. At the present fabrication operations, a fin trench may be formed by partially recessing fin 108 and removing respective materials between spacer liners 136 and source or drain (S/D) regions 140 may be formed within the fin trenches.

The fin trench may be a cavity or recess formed within fin 108, as depicted in the X cross-section, and formed between spacer liners 136, as depicted in the Y cross-section. Undesired portions of fin 108 and materials between spacer liners 136 (e.g. outer spacer 126, inner spacer 124, gate dielectric 106, etc.) may be removed by known patterning, lithography, and etching techniques. In some embodiments, fin 108 material may be removed between facing spacer liners 136 of neighboring sacrificial gate structures in the X cross section and material(s) may be removed between spacer liners 136 in the Y cross section, as depicted. The bottom surface of fin trench may be coplanar with the top surface of STI region(s) 104. As depicted in the Y cross-section, the fin may be recessed within the fin trench so the top surface of fin 108 may be coplanar with the top surface of STI regions 104.

The fin trench may expose respective facing vertical sidewalls of spacer liner 136, may form a bottom well surface and respective facing vertical sidewalls of fin 108. Such respective vertical sidewalls of the fin trench may be coplanar with the outward sidewall of spacer liner 136 associated with a sacrificial gate structure, there above.

S/D region 140 may be formed within the fin trench by epitaxially growing S/D material from one or more exposed semiconductor surface(s) (e.g., substrate 102, fin 108, etc.). Exemplary S/D region 140 materials may be but are not limited to: Si, Ge, SiGe, SiC, or the like.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial Si, SiGe, and/or SiC can be doped during deposition (in-situ doped) by adding dopants, n-type dopants (e.g., phosphorus or arsenic) or p-type dopants (e.g., boron or gallium), depending on its inclusion within a pFET or a nFET.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material can include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

In some embodiments, as depicted in the Y cross section, respective S/D regions 140 physically connected to different or neighboring channel fins 108 may grow together to form a single S/D region 140 that is physically and electrically connected to the different fins 108.

Figure 11:
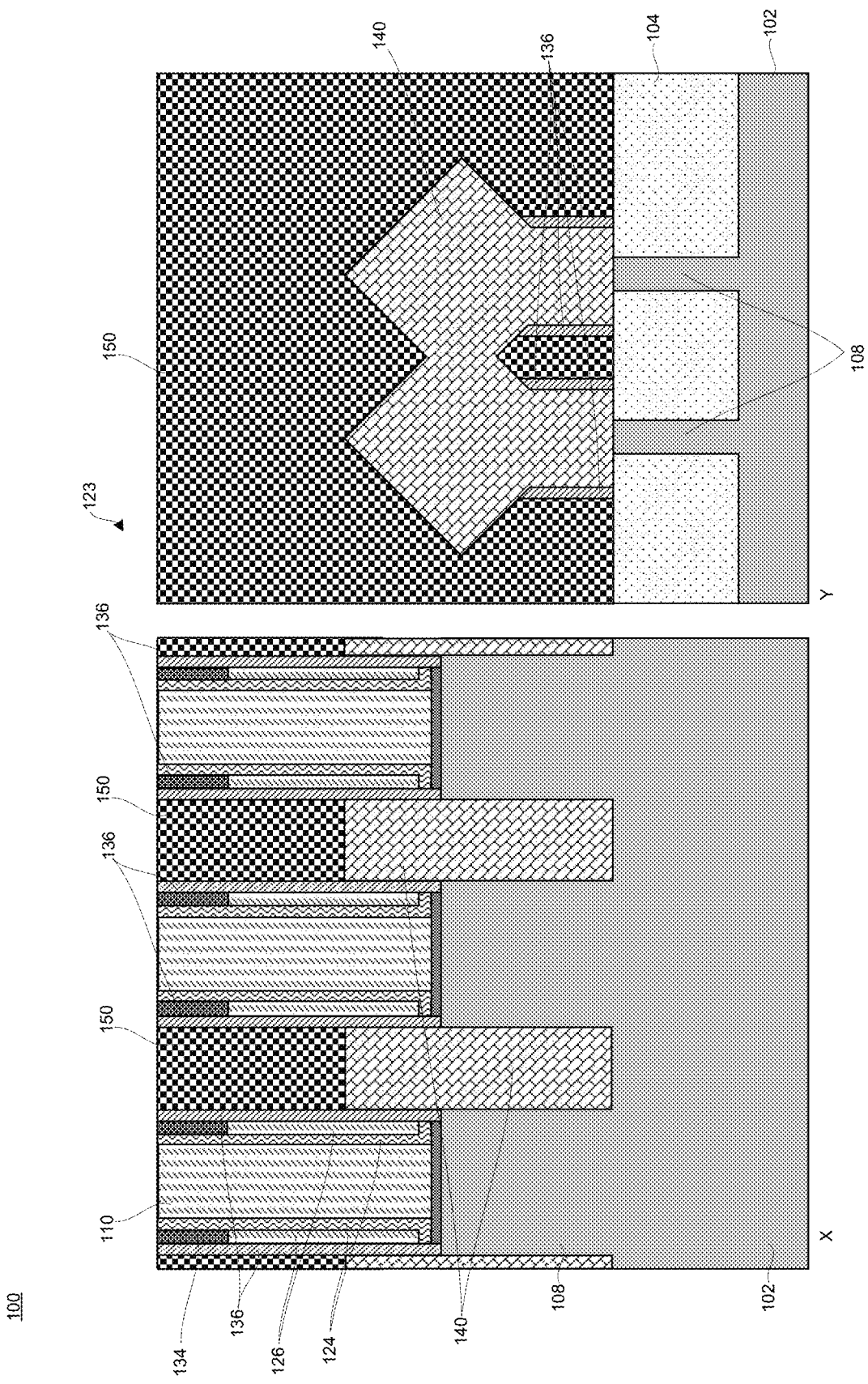

FIG. 11 depicts cross-sectional views of semiconductor structure 100 shown after a fabrication operation, in accordance with one or more embodiments. At the present fabrication operation, an interlayer dielectric (ILD) 150 may be formed and the semiconductor device 100 may be recessed, planarized, or the like.

The ILD 150 may be formed by depositing a dielectric material by PVD, CVD, ALD, or the like. Exemplary ILD 150 material(s) may be but are not limited to: $SiO_2$, a thin liner of SiN followed by $SiO_2$, or the like.

ILD 150 may be formed within crevasses, trenches, or the like, within semiconductor device 100. For example, as depicted in the X cross-section, ILD 150 may be formed between spacer liners 136 of neighboring sacrificial gate structures and upon S/D region 140. As depicted in the Y cross-section, ILD 150 may be formed upon STI region(s) 104, upon spacer liners 136, and upon and around S/D region(s) 140.

Subsequently, the top surface of semiconductor structure 100 may be planarized by, e.g., an etch, a CMP, or the like. For example, the respective top surfaces of ILD 150, spacer liner 136, spacer ear 134, inner spacer 124, and sacrificial gate 110 may be coplanar. During this material removal stage, gate mask 112 may be removed thereby exposing the underlying sacrificial gate 100 material.

Figure 12:
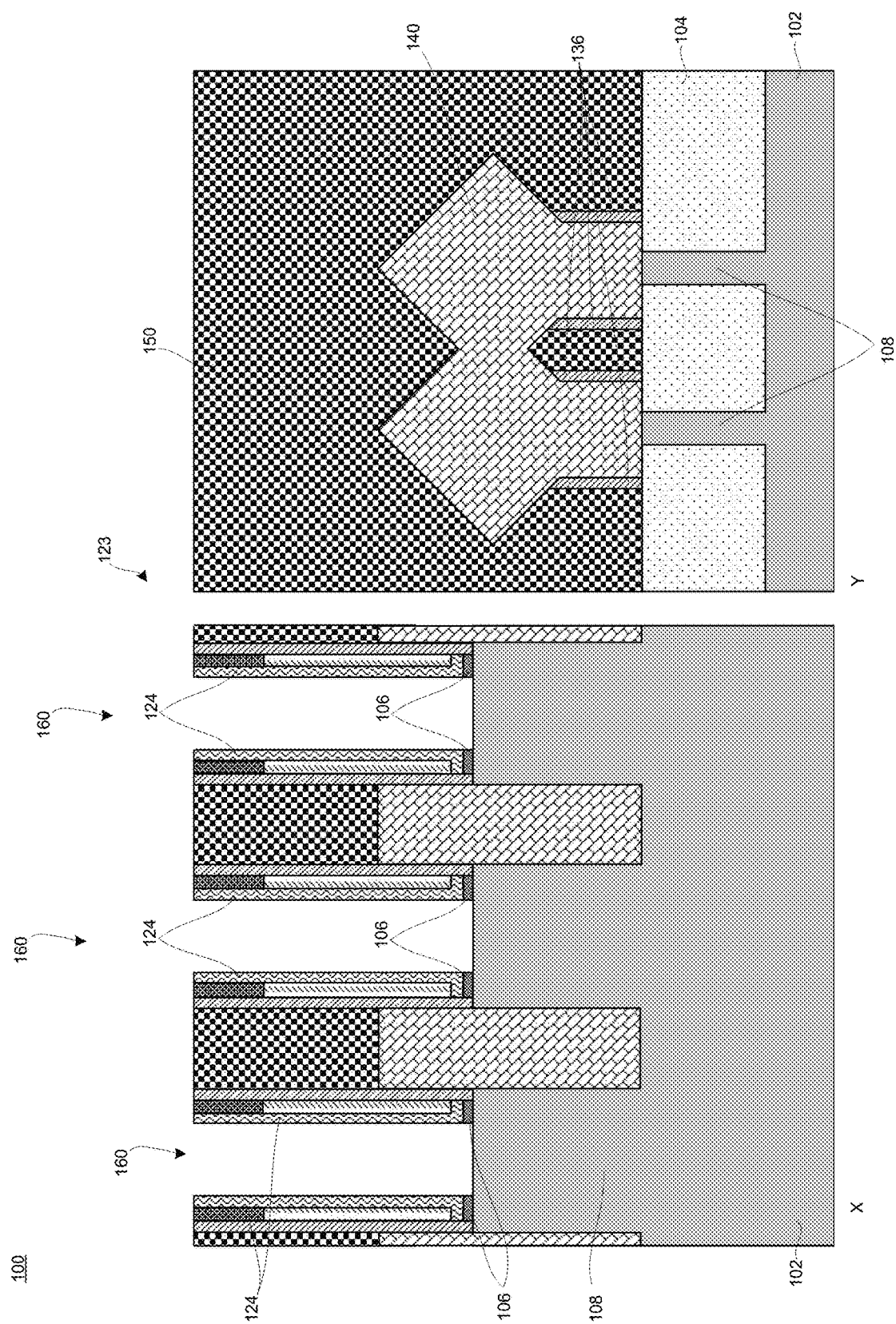

FIG. 12 depicts cross-sectional views of semiconductor structure 100 shown after a fabrication operation, in accordance with one or more embodiments. At the present fabrication operation, sacrificial gate 110 material and gate dielectric 106 thereunder may be removed.

The sacrificial gate 110 and gate dielectric 106 thereunder may be removed by known patterning, lithography, etching, etc. techniques and may form a replacement gate trench 160. The replacement gate trench 160 may expose at least a portion of sidewalls or side surfaces of one or more fins 108. Further, the replacement gate trench 160 may expose at least a portion of the sidewall or side surface of inner spacer 124 and a side surface of gate dielectric 106. While portions of the gate dielectric 106 under the sacrificial gate 110 may be removed other portions of the gate dielectric 106 under the multilayer spacer 123 may be retained.

Figure 13:
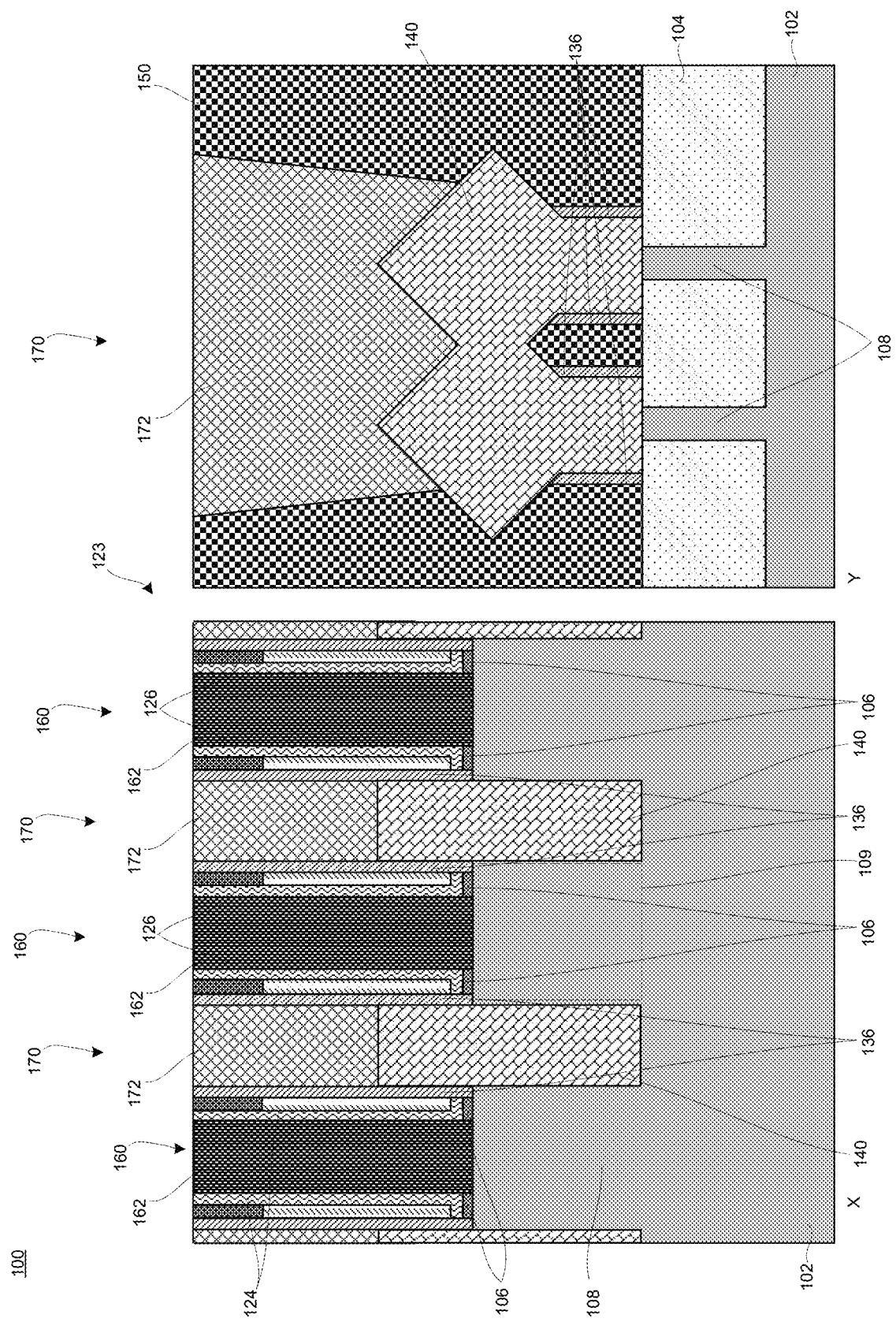

FIG. 13 depicts cross-sectional views of semiconductor structure 100 shown after a fabrication operation, in accordance with one or more embodiments. At the present fabrication operation, replacement gate 162 may be formed within replacement gate trench 160 and S/D contact 172 may be formed within a S/D contact trench 170.

A replacement gate structure may be formed by depositing a gate dielectric liner, by depositing work function metal(s), which may also be referred herein as replacement gate 160, recessing the replacement gate 160 (if needed) by PVD, CVD, ALD, or the like, within replacement gate trench 160. Exemplary gate dielectric materials may be but are not limited to: $SiO_2$, $HfO_2$, $ZrO_2$, $HfZrO_2$, HfAlOx, HfSiOx, or the like. Exemplary replacement gate 160 materials may be but are not limited to: TiN, TiC, TiAlC, TaN, or the like. After replacement gate 160 deposition, a low resistance conductive gate metal, such as W or Al, can be further deposited.

The replacement gate structure may be formed around the fin 108, such that the replacement gate structure is formed around or upon the exposed portions of the fin 108 sidewalls or side surfaces.

The replacement gate structure may be physically connected to a channel region 109 of one or more fins 108. The channel region(s) 109 may also be physically connected to appropriate S/D regions 140 on each side of channel region(s) 109, as depicted in the X cross-section.

S/D contact trench 170 may be formed by removing ILD 150 between spacer liner 136, as depicted in the X cross-section, and by removing a portion of the ILD 150 above S/D region 140, as depicted in the Y cross-section. S/D contact trench 170 may be removed by known patterning, lithography, etching, etc. techniques. The S/D contact trench 170 may expose at least a portion of the underlying S/D region 140. Further, the replacement gate trench 160 may expose at least a portion of the sidewall or side surface of spacer liner 136.

S/D contact 172 may be formed by depositing a conductive material within S/D contact trench 170. Exemplary S/D contact 172 materials may include a silicide liner, such as Ti, Ni, NiPt, etc, followed by adhesion metal liner, such as TiN, TaN, TiC, etc, followed by conductive low resistance metal fill, such as W, Co, Ru, Cu, etc. After metal deposition, a contact metal CMP process can be used to remove excessive contact metals that are deposited over ILD 150 and replacement gate 160.

Figure 14:
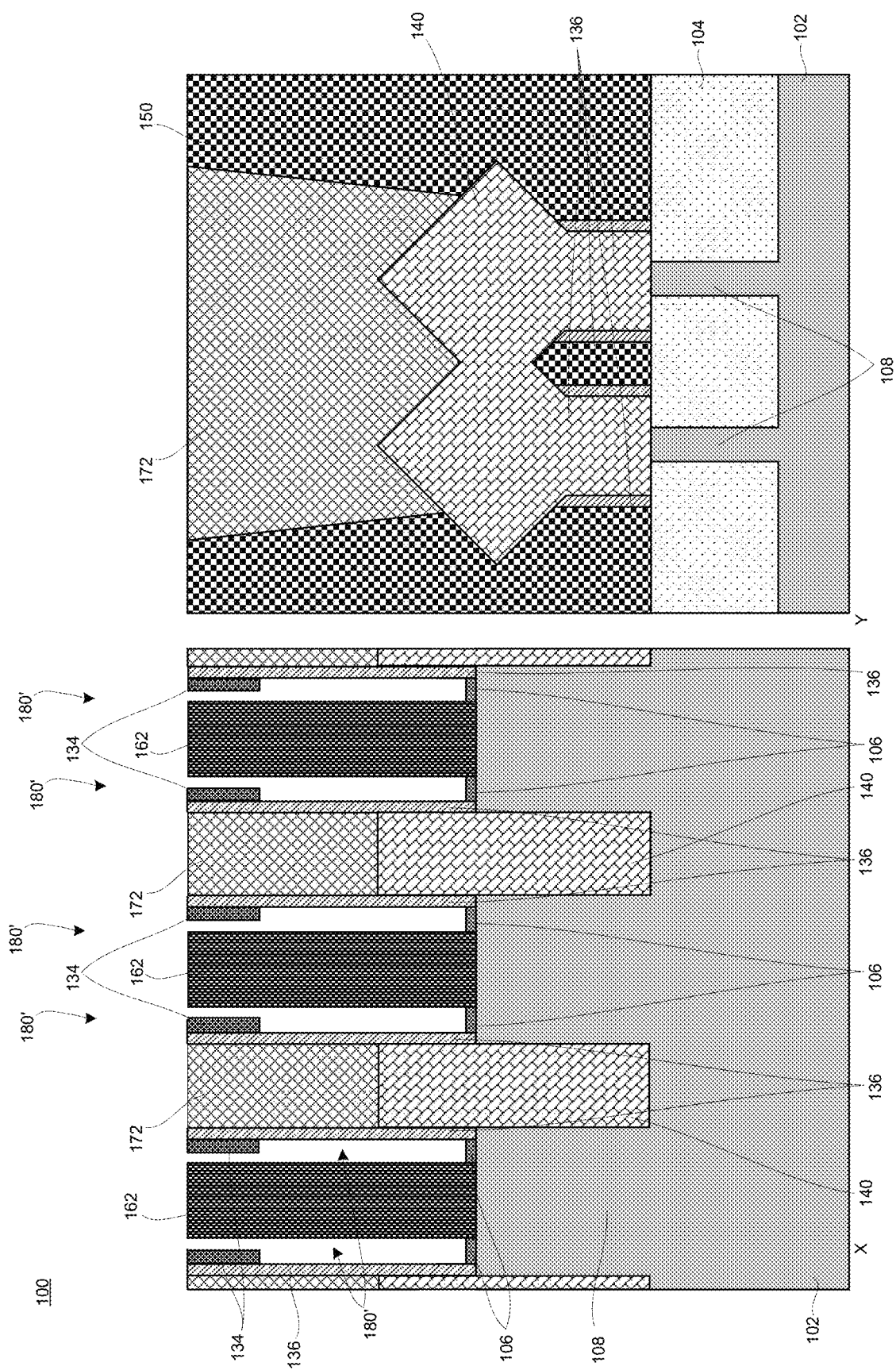

FIG. 14 depicts cross-sectional views of semiconductor structure 100 shown after a fabrication operation, in accordance with one or more embodiments. At the present fabrication operation, multilayer spacer 123 may be removed which may result in forming air-gap 180'.

Utilizing known patterning, lithography, etching, etc. techniques, multilayer spacer 123 (i.e. inner spacer 124 and outer spacer 126) may be removed. For example, inner spacer 124 and outer spacer 126 may be etched selective to materials of the exposed surfaces of structure 100 (e.g., replacement gate 162, spacer liner 136, spacer ear 134, gate dielectric 106, ILD etc.). Removal of multilayer spacer 123 may occur in a single or multiple stage etching process. For example, inner spacer 124 may initially be removed by an appropriate etchant. Subsequently, outer spacer 126 may be removed by an appropriate or different etchant. The removed multilayer spacer 123 material may respectively form air-gap 180' located between spacer liner 136 and the associated replacement gate structure and further located between spacer ear 134 and the associated replacement gate structure.

Air-gap spacer 180' may expose at least a portion of the sidewall of replacement gate 162, may expose the sidewall and bottom surface of spacer ear 134, may expose a portion of the sidewall of spacer liner 132, and may expose the upper surface of gate dielectric 106.

Figure 15:
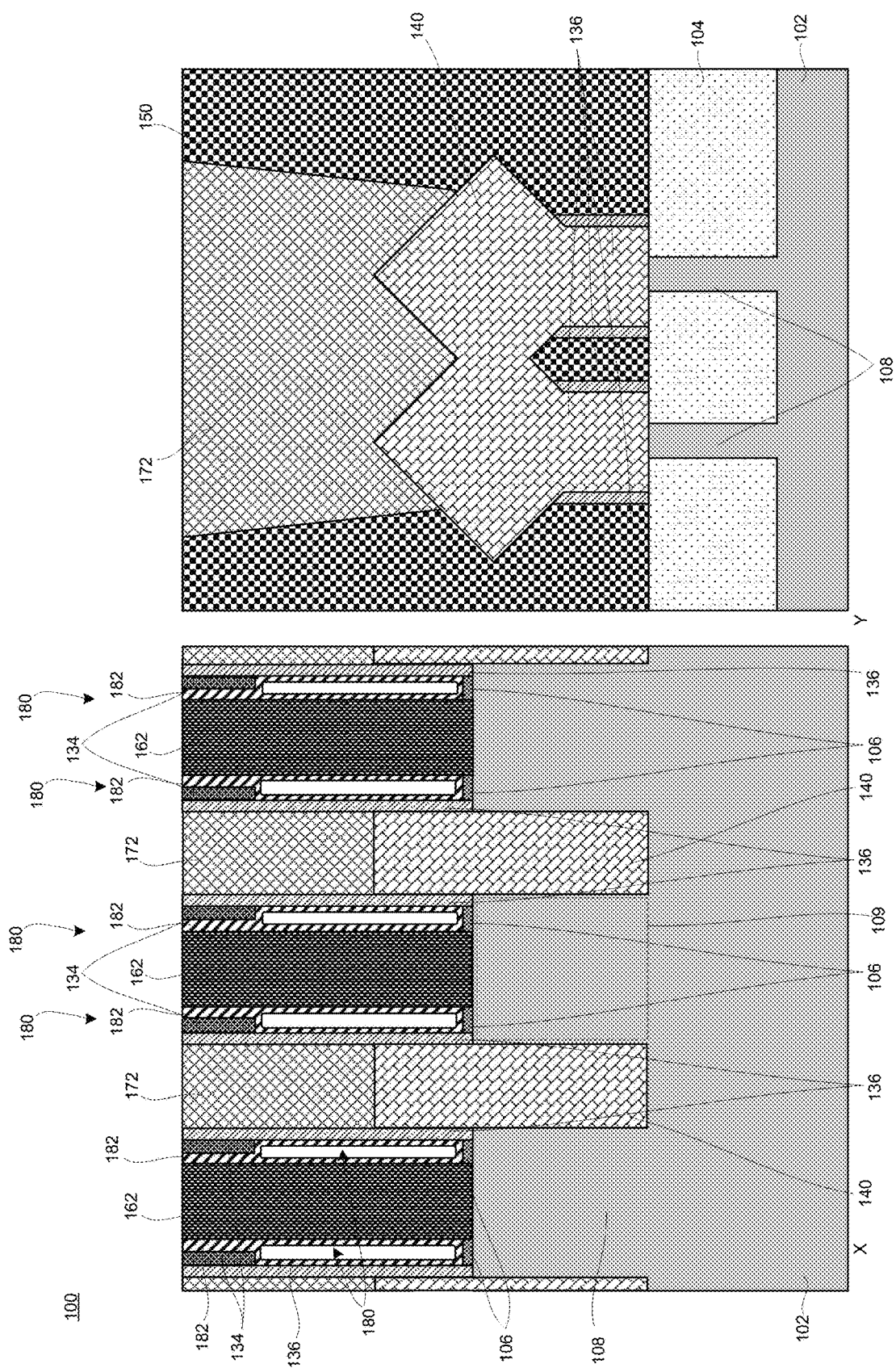

FIG. 15 depicts cross-sectional views of semiconductor structure 100 shown after a fabrication operation, in accordance with one or more embodiments. At the present fabrication operation, air-gap spacer 180' may be lined with dielectric 182, which may result in the formation of air-gap 180.

Dielectric 182 may be formed by depositing a dielectric material by PVD, CVD, ALD, or the like, to line the inner surfaces of air-gap spacer 180'. Exemplary dielectric 182 material(s) may be but are not limited to: $SiO_2$, SiN, SiOC, SiOCN, SiBCN, or the like.

Dielectric 182 may be formed within air-gap spacer 180' upon the inner exposed portion of the sidewall of replacement gate 162, upon the inner exposed sidewall and bottom surface of spacer ear 134, upon the inner exposed portion of the sidewall of spacer liner 132, and upon the inner exposed upper surface of gate dielectric 106.

The dielectric 182 liner may be formed to a thickness sufficient enough to pinch off or otherwise fill the volume between spacer ear 134 and the replacement gate structure while also retaining the air-gap spacer 180 substantially vertical along lower portions of the sidewalls of the replacement gate structure.

In some embodiments, as depicted, air-gap spacer 180 may be formed as a substantially vertical void upon bottom sidewall portion(s) of the replacement gate structure, while the area or volume above air-gap spacer 180 is filled with or is otherwise solid material(s).

Subsequently, the top surface of semiconductor structure 100 may be planarized by, e.g., a CMP, or the like. For example, the respective top surfaces of the replacement gate structure, dielectric 182, spacer ear 134, spacer liner 136, S/D region contact 172, ILD 150, etc., may be coplanar.

Figure 16:
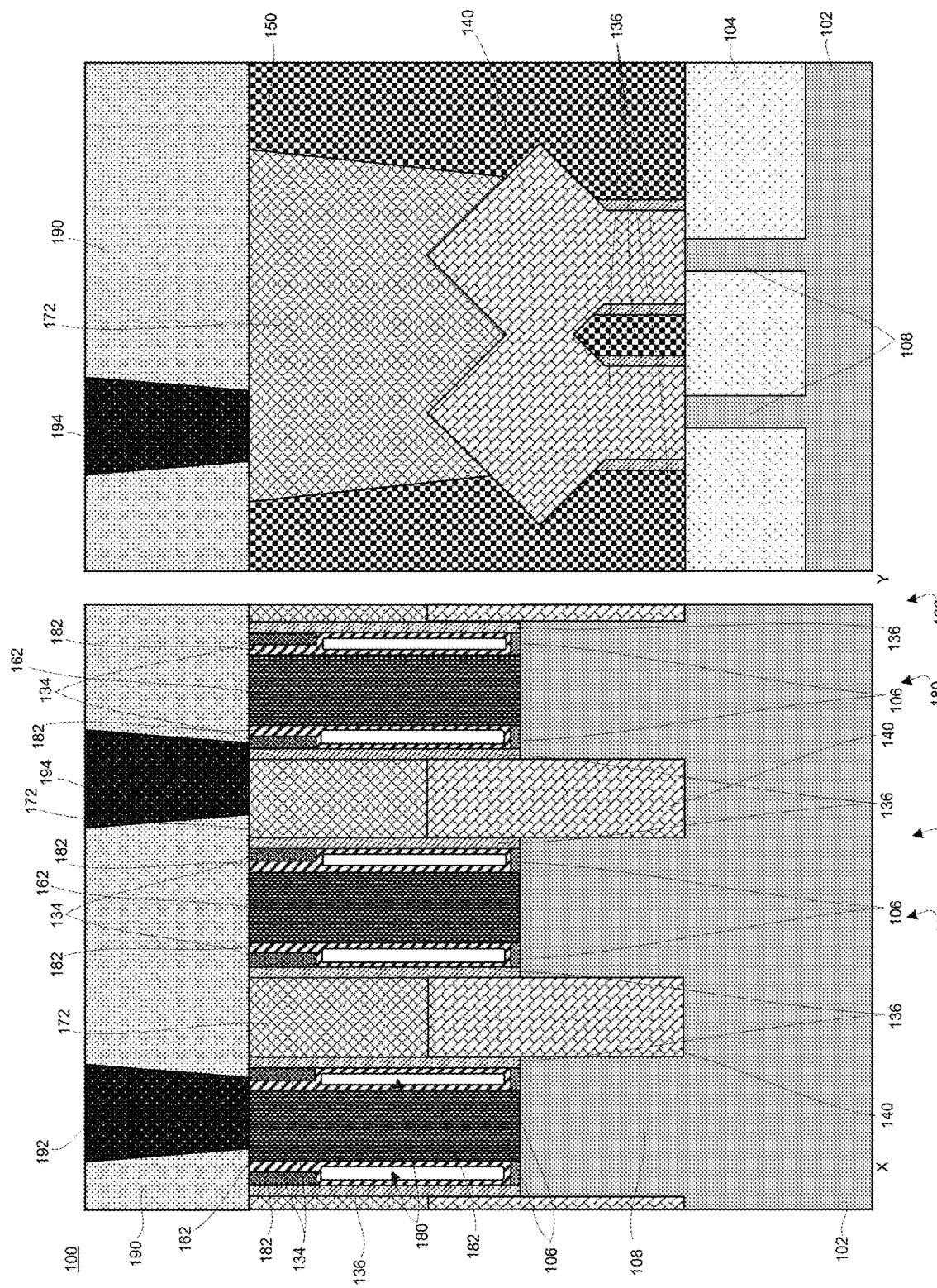

FIG. 16 depicts cross-sectional views of semiconductor structure 100 shown after a fabrication operation, in accordance with one or more embodiments. At the present fabrication operation, middle of the line (MOL) contacts and/or back end of the line (BEOL) vias are formed in the upper interlayer dielectric (ILD) layer 190.

MOL contacts and/or BEOL vias may be formed by initially depositing one or more upper ILD layer 190 dielectric material(s) by PVD, CVD, ALD, or the like. Upper ILD layer 190 can have a thickness of from about 20 nm to about 200 nm, although other thicknesses are within the contemplated scope. Exemplary upper ILD layer 190 material(s) may be but are not limited to: SiO2, or low-k dielectric with k value <3.9. In particular embodiments, the upper ILD layer 190 may be formed upon the exposed upper surface structure 100 surfaces, as depicted. MOL contacts or lowest BEOL vias can be formed by known lithography and etch processes with subsequent conductive metal filling so as to form the MOL contacts and/or BEOL VIAs, such as contacts 192, 194.

In a particular embodiment, as depicted, layer 190 may be a upper MOL contact layer and MOL contacts 192, 194 are formed to physically contact the replacement gate 160 and S/D region contact 172, respectively. The contact 192 may be formed or located above and in physical contact with a replacement gate structure and may be referred to as a gate contact. The contact 194 may be formed or located above and in physical contact with S/D region contact 172 and may be referred to as a upper S/D region contact.

For clarity, semiconductor device 100 may include the air-gap spacer 180 that is substantially vertical upon the sidewalls of the replacement gate structure. A spacer ear 134 may be above a portion of the air-gap spacer 180. A portion of air-gap spacer liner 182 may further be above another portion of the air-gap spacer 180. The air-gap spacer 180 may be between the replacement gate structure and spacer liner 136 which may be located upon a portion of a sidewall of a S/D region 140 and/or sidewall of the S/D region contact 172.

MOL contact 192 may be above and physically connected to the replacement gate structure and MOL contact 194 may be above and physically connected to S/D region contact 172. The solid material structure of the air-gap spacer liner 182, spacer ear 134, and/or spacer liner 136, generally located above the air-gap spacer 180 may serve as an etch stop during the contact 192, 194 trench and/or VIA fabrication stage. As depicted, due to these solid material structure(s), the contact 192, 194 may be misaligned to the underlying replacement gate or S/D region contact 172 and may be directly vertically in line with the air-gap spacer 180 there below. Whereas potential misalignment in prior air-gap spacer designs may have resulted in subway defects, such solid material structure(s) may effectively stop or otherwise reduce the propensity of the contact 192, 194 trench extending into the underlying air-gap spacer, thereby decreasing the propensity of subway defects, and increasing the yield of the semiconductor device 100 fabrications.

Figure 17:
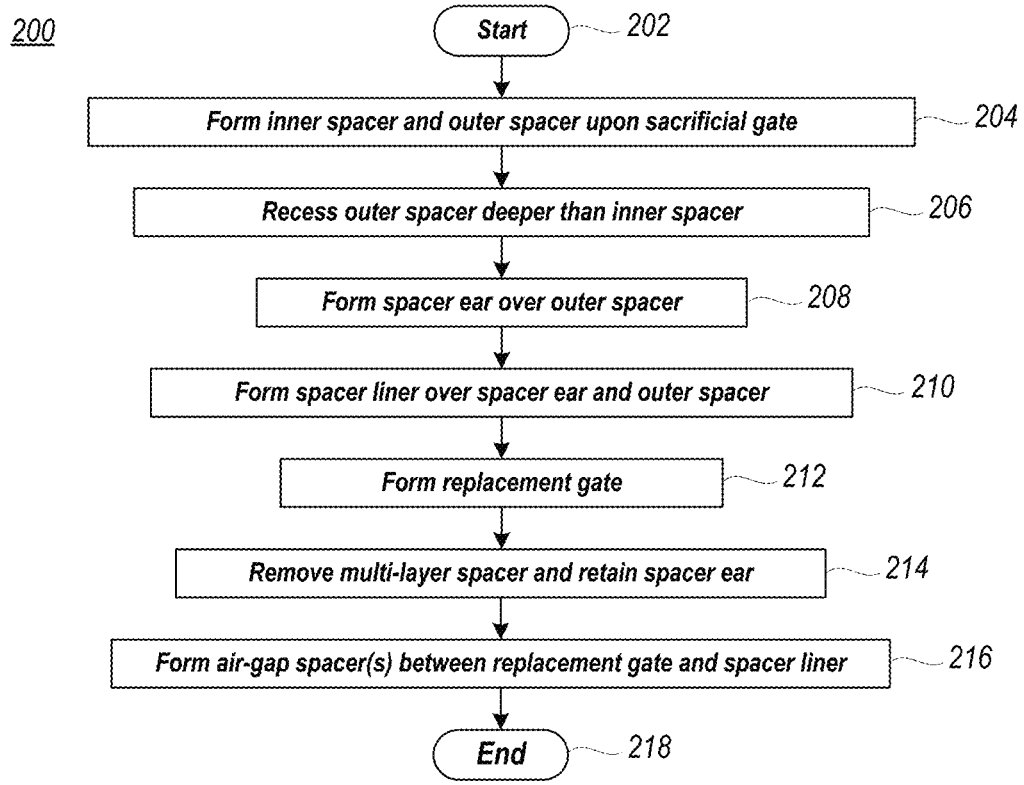
FIG. 17 is a flow diagram illustrating a semiconductor device fabrication method, in accordance with one or more embodiments.

FIG. 17 is a flow diagram illustrating a semiconductor device 100 fabrication method 200, in accordance with one or more embodiments. Method 200 begins at block 202 and may continue with forming multilayer spacer 123 upon sidewalls of a sacrificial gate structure (block 204). For example, the multilayer spacer 123 is formed upon substrate 102, or upon STI regions 104 that are upon substrate 102 and formed upon and around one or more fins 108 and upon and around one or more sacrificial gate structures. Undesired multilayer spacer 123 material may be removed while desired multilayer spacer 123 material may be retained upon at least the sidewalls of the one or more replacement gate structures.

Method 200 may continue with recessing the outer spacer 126 of the multilayer spacer 123 deeper or otherwise below the inner spacer 124 of multilayer spacer 123 (block 206). Utilizing known patterning, lithography, etching, etc. techniques, undesired portions of outer spacer 126 may be removed, while desired portions of outer spacer 126 may be retained. For example, outer spacer 126 may be recessed by a etch selective to materials of the exposed surfaces of structure 100 (e.g., gate mask 112, inner spacer 124, soft mask 130, etc.). The removed multilayer spacer 123 material may respectively form spacer trench 132 located between inner spacer 124 and soft mask 130 and further located above the retained outer spacer 126.

Method 200 may continue with forming spacer ear 134 upon the recessed outer spacer 126 (block 208). The spacer ear 134 may be formed directly upon the recessed outer spacer 126 within spacer trench 132. The outer sidewalls of spacer ear 134 may be substantially coplanar with respective outer sidewalls of outer spacer 126, respective inner sidewalls of spacer ear 134 may be substantially coplanar with respective inner sidewalls of inner spacer 124, respective top surfaces of spacer ear 134 may be substantially coplanar with respective top surfaces of the sacrificial gate structure.

Method 200 may continue with forming spacer liner 136 upon the spacer ear 134 and upon outer spacer 126 (block 210). Spacer liner 136 may be substantially vertical and may be formed upon the sidewall of spacer ear 134, upon the sidewall of outer spacer 126, upon the sidewall of lower horizontal portion of inner spacer 124, upon a sidewall of gate dielectric 106, upon fin 108, and/or upon STI region 104, as is depicted in e.g., FIG. 9.

Method 200 may continue with removing the sacrificial gate structure and forming a replacement (e.g., metal, etc.) gate structure in place thereof (block 212). Method 200 may continue with removing the multilayer spacer 123 and retaining spacer ear 134, subsequent to the formation of the replacement gate structure (block 214). For example, inner spacer 124 and outer spacer 126 may be etched selective to materials of the exposed surfaces of structure 100 (e.g., replacement gate 162, spacer liner 136, spacer ear 134, gate dielectric 106, ILD etc.). Removal of multilayer spacer 123 may occur in a single or multiple stage etching process. For example, inner spacer 124 and outer spacer 126 may be simultaneously removed by an appropriate etchant. The removed multilayer spacer 123 material may respectively form air-gap 180' located between spacer liner 136 and the associated replacement gate structure and further located between the retained spacer ear 134 and the associated replacement gate structure.

Method 200 may continue with forming air-gap spacer 180 between the replacement gate structure and the spacer liner 136 (block 216). In some embodiments, air-gap spacer 180' may be lined with dielectric 182, which may result in the formation of air-gap 180. Dielectric 182 may be formed within air-gap spacer 180' upon the inner exposed portion of the sidewall of replacement gate 162, upon the inner exposed sidewall and bottom surface of spacer ear 134, upon the inner exposed portion of the sidewall of spacer liner 132, and upon the inner exposed upper surface of gate dielectric 106. The dielectric 182 liner may be formed to a thickness sufficient enough to pinch off or otherwise fill the volume between spacer ear 134 and the replacement gate structure while also retaining the air-gap spacer 180 substantially vertical along lower portions of the sidewalls of the replacement gate structure. In some embodiments, as depicted, air-gap spacer 180 may be formed as a substantially vertical void between bottom sidewall portion(s) of the replacement gate structure and the spacer liner 136 upon the sidewall(s) of a neighboring S/D region 140 and/or S/D region contact 172. Method 200 may end at block 218.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

The invention claimed is:

1. A semiconductor device comprising:
a gate structure upon and around a fin;
a source or drain (S/D) region connected to the fin;
a spacer liner upon a sidewall of the S/D region facing the gate structure;
an air-gap spacer between a sidewall of the gate structure and a sidewall of the spacer liner;
a liner around the air-gap spacer, the liner comprising a liner portion above the air-gap spacer and directly upon the sidewall of the gate structure; and
a spacer ear above the air-gap spacer and directly upon the liner portion and directly on the sidewall of the spacer liner.

2. The semiconductor device of claim 1, further comprising:
a dielectric layer upon the gate structure, upon the dielectric liner, and upon the spacer ear;
a gate contact within the dielectric layer and upon the gate structure.

3. The semiconductor device of claim 2, wherein the gate contact is further upon the spacer ear.

4. The semiconductor device of claim 3, wherein a top surface of the spacer ear is coplanar with a bottom surface of the gate contact.

5. The semiconductor device of claim 4, further comprising:
a S/D region contact upon the S/D region, and wherein the spacer liner is further upon a sidewall of the S/D region contact facing the gate structure.

6. A semiconductor device comprising:
a gate structure upon and around a fin pair comprising: a first fin and a second fin;
a source or drain (S/D) region connected to the first fin and to the second fin;
a spacer liner upon a sidewall of the S/D region facing the gate structure;
an air-gap spacer between a sidewall of the gate structure and a sidewall of the spacer liner;
a liner around the air-gap spacer, the liner comprising a liner portion above the air-gap spacer and directly upon the sidewall of the gate structure; and
a spacer ear above the air-gap spacer and directly upon the liner portion and directly on the sidewall of the spacer liner.

7. The semiconductor device of claim 6, further comprising:
a dielectric layer upon the gate structure, upon the dielectric liner, and upon the spacer ear;
a gate contact within the dielectric layer and upon the gate structure.

8. The semiconductor device of claim 7, wherein the gate contact is further upon the spacer ear.

9. The semiconductor device of claim 8, wherein a top surface of the spacer ear is coplanar with a bottom surface of the gate contact.

10. The semiconductor device of claim 9, further comprising:
   a S/D region contact upon the S/D region, and wherein the spacer liner is further upon a sidewall of the S/D region contact facing the gate structure.

11. The semiconductor device of claim 1, wherein a bottom surface of the spacer liner is substantially coplanar with a top surface of the fin and wherein a top surface of the spacer liner is substantially coplanar with a top surface of the gate structure.

12. The semiconductor device of claim 4, wherein a bottom surface of the spacer liner is substantially coplanar with a top surface of the fin and wherein a top surface of the spacer liner is substantially coplanar with a top surface of the S/D region contact.

13. The semiconductor device of claim 1, wherein the liner is directly upon a top surface of a gate dielectric.

14. The semiconductor device of claim 1, wherein the liner is directly upon the sidewall of the spacer liner.

15. The semiconductor device of claim 2, wherein the gate contact is further upon the liner portion.

16. The semiconductor device of claim 6, wherein a bottom surface of the spacer liner is substantially coplanar with a top surface of the fin and wherein a top surface of the spacer liner is substantially coplanar with a top surface of the gate structure.

17. The semiconductor device of claim 10, wherein a bottom surface of the spacer liner is substantially coplanar with a top surface of the first fin and a top surface of the second fin and wherein a top surface of the spacer liner is substantially coplanar with a top surface of the S/D region contact.

* * * * *